United States Patent [19]

DeRouen et al.

[11] 4,323,293
[45] Apr. 6, 1982

[54] TERMINAL LEAD WITH LABYRINTHINE CLIP

[75] Inventors: Joseph R. DeRouen, Banning; Ronald E. Smith, Sunnymead, both of Calif.

[73] Assignee: Bourns, Inc., Riverside, Calif.

[21] Appl. No.: 164,760

[22] Filed: Jun. 30, 1980

[51] Int. Cl.³ .............................................. H01L 23/48
[52] U.S. Cl. ................... 339/17 CF; 357/70; 29/827
[58] Field of Search ............... 174/52 FP; 339/17 CF, 339/179, 276 SF; 29/827; 357/65, 68, 69, 70

[56] References Cited

U.S. PATENT DOCUMENTS

| | | | |
|---|---|---|---|
| 3,597,666 | 8/1971 | Taskovich | 357/70 |
| 3,689,684 | 9/1972 | Cox et al. | 174/52 FP X |
| 3,735,017 | 5/1973 | Manning | 174/52 FP |
| 4,012,579 | 3/1977 | Fox et al. | 174/52 FP X |

*Primary Examiner*—Eugene F. Desmond
*Attorney, Agent, or Firm*—William G. Becker; Howard J. Klein

[57] ABSTRACT

A terminal lead for a miniature electronic component or the like includes an integral clip formed at one end for engagement with a substrate onto which the component has been deposited. The clip has a labyrinthine configuration which provides a secure grip on the substrate through extended length contact therewith. This extended length contact also reduces stress on the solder joint between the lead and a metallized contact area on the substrate, while also providing improved sealing with a molded plastic housing which encases the substrate.

5 Claims, 13 Drawing Figures

FIG. 4.b

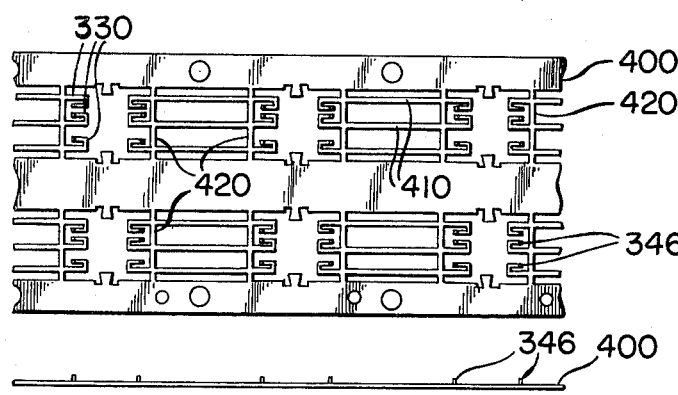
FIG. 6
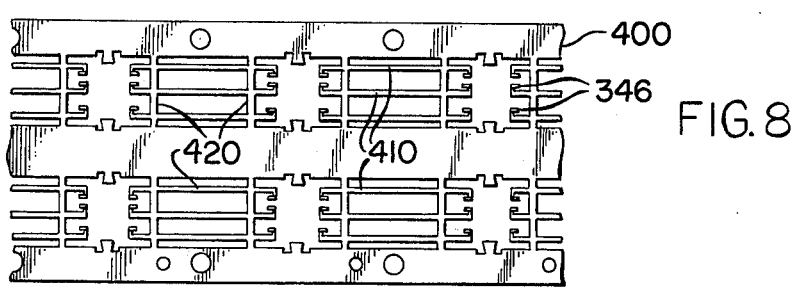
FIG. 7
FIG. 8
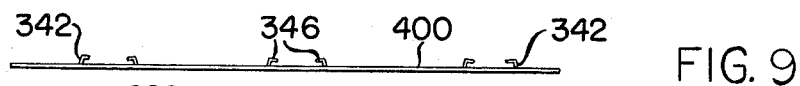
FIG. 9
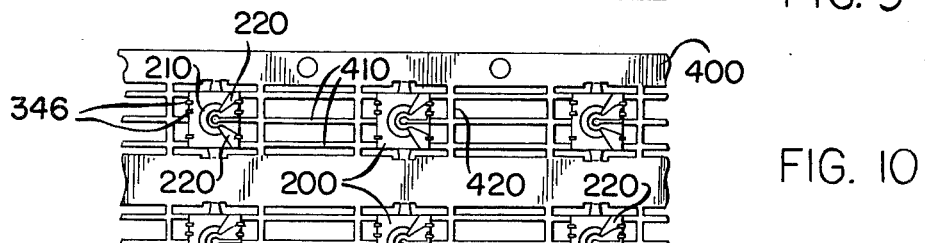
FIG. 10
FIG. 11
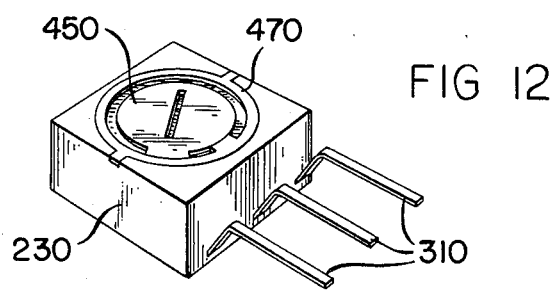
FIG 12

TERMINAL LEAD WITH LABYRINTHINE CLIP

BACKGROUND OF THE INVENTION

1. Field of the Invention

This invention relates to terminal leads for electronic components, and in particular it relates to a terminal lead having an improved clip for attachment to the substrate onto which a miniature solid state electronic component is deposited.

2. Description of the Prior Art

The use of miniature solid state electronic components has grown dramatically in recent years. One such type of component enjoying particular popularity is the type in which a solid state component is deposited on a ceramic substrate, with metallized areas deposited on the substrate as electrical contacts for the component. Terminal leads are soldered to the contact areas, and the substrate is finally encased in a molded plastic housing. Such a construction has become increasingly popular, for example, for miniature potentiometers employing a deposited carbon or cermet resistive element.

One persistent problem with this type of construction relates to the connection between the terminal leads and the metallized areas on the substrate. Prior to soldering, a mechanical connection is obtained by engaging the substrate in a clip-like member formed in the end of the lead. This clip-like member or "terminal clip" is typically formed by a pair of prongs, one of which is bent upwardly, and the other of which is usually unbent, but may be bent downwardly. The substrate is thus grasped between the two prongs. This arrangement has two major shortcomings, both resulting from the limited length of the terminal lead which is encased in the housing.

Firstly, because there is such a relatively short length of lead extending into the housing to the solder joint, any bending of the lead subsequent to the encasement of the substrate will cause a major portion of the resulting stress to be applied to the solder joint, thereby weakening the joint and making repeated lead bending inadvisable if the integrity of the joint is to be assured.

Secondly, since there is only a limited contact area between the terminal lead and the housing material, and since a substantial portion of this contact area is between the edge of the substrate and the surface of this housing, adequate sealing of the substrate from the outside environment cannot easily be assured, especially when thermoplastics are used for the housing material. Thus, at present, thermosets, which take a relatively long time to mold, are typically used for the housings.

In view of the foregoing, it can be appreciated that there has been a long-felt need for a terminal clip structure which provides stress relief for the solder joint, while also providing an improved sealing capability when the substrate is encased in its associated housing.

SUMMARY OF THE INVENTION

Broadly, the present invention is a terminal lead having a terminal clip construction which provides an extended length of the terminal lead extending, with the housing, from the exterior surface thereof to the solder joint between the clip and the substrate, with the major portion of this extended length being provided in an engaging contact with the substrate. This is accomplished through the use of a "labyrinthine" configuration for the terminal clip, whereby an extended length of the lead is situated in close proximity to the substrate, and, in fact, a relatively long length of the lead is in engaging or supporting contact with the substrate, thereby also providing a relatively large contact area with the housing material, which contact area is, necessarily, fairly deep within the housing.

More specifically, the labyrinthine configuration is achieved by providing a lead blank having a horizontal, hooklike bend (so that it somewhat resembles the letter "J"), and then bending the end of the horizontally hook-shaped portion so formed upwardly to form a vertically hook-shaped portion. The resulting structure somewhat resembles the letter "S", with the upper and lower loops being in orthogonal planes, the lower loop being substantially horizontal and the upper loop being substantially vertical. The substrate is thus grasped between the upper (vertical) loop and the lower (horizontal) loop, with contact being made with substantially the entire length of the lead which forms the lower loop, and at least a part of that portion of the lead forming the upper loop (the latter contact area being the area of the solder joint between the terminal clip and the metallized area of the substrate).

Thus, as will be explained in further detail below, the labyrinthine structure of the clip portion of the lead provides an extended length of lead in contact with, or in close proximity to, the substrate, so that encasement of the substrate in the housing necessarily provides extended length contact between the terminal clip and the housing material. This extended length contact, in turn, provides the invention's dual objects of improved sealing between the terminal lead and the housing, and the removal of a significant portion of the stress from the solder joint between the clip and the metallized contact area of the substrate.

BRIEF DESCRIPTION OF THE DRAWINGS

Further advantages and features of the present invention will be more fully apparent to those skilled in the art to which the invention pertains from the ensuing detailed description thereof, regarded in conjunction with the accompanying drawings, wherein like reference characters refer to like parts throughout, and in which:

FIG. 4b is a side elevational view of the terminal lead of FIG. 3 showing its attachment to a substrate;

FIG. 6 is a top plan view of a lead frame blank after the first bending step in the formation of terminal leads in accordance with the present invention;

FIG. 7 is a side elevational view of the lead frame blank of FIG. 6;

FIG. 8 is a top plan view of a lead frame after completion of the second bending step in the formation of terminal leads in accordance with the present invention;

FIG. 9 is a side elevational view of the lead frame of FIG. 8;

FIG. 10 is a top plan view of the lead frame of FIG. 8 after emplacement of the substrate thereon;

FIG. 11 is a side elevational view of the lead frame and substrate shown in FIG. 10; and FIG. 12 is a perspective view of a miniature potentiometer having terminal leads constructed in accordance with the present invention.

DETAILED DESCRIPTION OF THE INVENTION

Although a specific embodiment of the invention will now be described with reference to the drawings, it should be understood that such an embodiment is by way of example only and is merely illustrative of several possible embodiments which can represent applications of the principles of the invention. Various changes and modifications, obvious to one skilled in the art to which the invention pertains, are deemed to be within the spirit, scope and contemplation of the invention as further defined in the appended claims.

Figure 1:
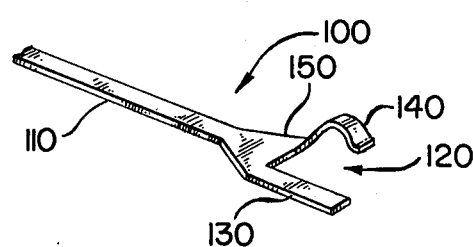
FIG. 1 is a perspective view of a typical prior art terminal lead.
Figure 2:
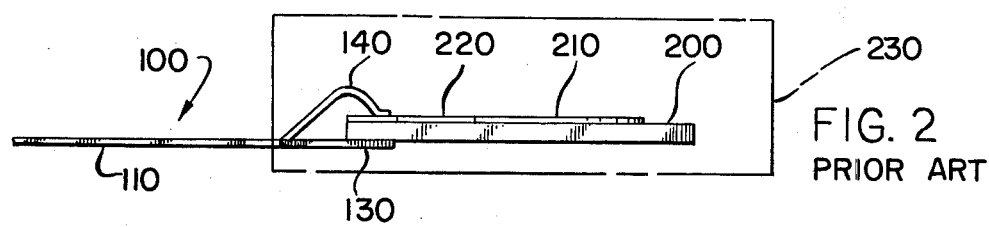
FIG. 2 is a side elevational view of the terminal lead of FIG. 1 attached to a substrate.

Referring first to FIGS. 1 and 2, a typical prior art terminal lead 100 is shown. The lead 100 is made of a flattened, elongate strip of metal having good electrical conductivity. The major portion of the length of the lead 100 is comprised of a substantially straight main body or shank portion 110. A terminal clip 120 is formed near one end of the shank 110. The terminal clip 120 is provided by a substantially straight, longitudinal prong 130 and a vertically-hooked prong or finger 140 extending upwardly and longitudinally from a widened portion 150 which, in turn, extends from one end of the shank 110.

As illustrated in FIG. 2, a ceramic substrate 200, having a solid state electronic component 210 and a metallized contact area 220 deposited on its top surface, is grasped between the longitudinal tab 130 and the end of the hook-like finger 140, forming a mechanical connection between the substrate 200 and the terminal lead 100 at the metallized contact area 220. To form a good electrical connection between the contact area 220 and the terminal lead 100, a solder joint (not shown) will be provided between the finger 140 and the contact area 220.

Ultimately, the whole substrate 200 and the terminal clip 120 are encased in a molded thermoset housing 230 (shown in dotted outline in FIG. 2). As can be seen in the drawing, there is only a relatively short length of the terminal lead encased within the housing and extending between the exterior surface thereof and the solder joint, nearly all of this length being provided by the finger 140. Moreover, there is only a limited area of contact between the housing material and the terminal lead, and, with the exception of the extension tab 130 and a part of the finger 140, all of this contact area is situated between the edge of the substrate and the surface of the housing.

From the above description, it can be seen that the prior art structure has at least two functional shortcomings. First, the relatively short length of embedded lead connected to the substrate at the solder joint results in a substantial portion of the bending stresses being applied to the joint, with the resultant eventual weakening of the joint alluded to previously. Secondly, the limited lead-to-housing material contact area produces the previously mentioned sealing difficulties, and this result is exacerbated by the location of the major portion of the contact area in the outer portion of the housing, i.e., between the edge of the substrate and the housing surface.

Figure 3:
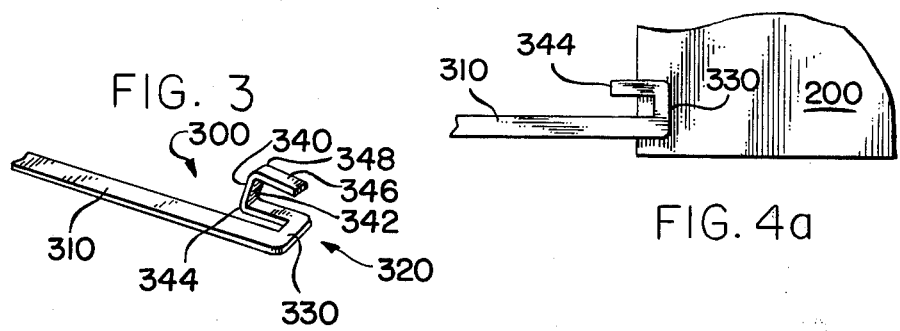
FIG. 3 is a perspective view of a terminal lead in accordance with the present invention.

FIG. 3 illustrates a terminal lead 300 constructed in accordance with the present invention. The lead 300, like the prior art lead 100, is made of a flat strip of electrically-conductive metal, and has a substantially straight main body or shank 310. The proximal (toward the substrate) end of the lead 300 is formed into a labyrinthine terminal clip 320, in the structure of which the present invention resides. This terminal clip 320 is provided by a first hook-like portion 330 in the horizontal plane, and a second hook-shaped portion 340, integral and contiguous with the end of the first hook-shaped portion, formed by bending the end of the horizontally hook-shaped portion in the vertical plane. Thus, the second hook-shaped portion has a substantially vertical leg 342 formed by a first bend 344, and a substantially horizontal, inwardly (or proximally) extending tab 346 formed by a second bend 348.

Thus, as can be seen in FIG. 3, the novel terminal clip 320 of the invention is comprised of a type of "S"-shaped structure, with the lower "loop" in the horizontal plane and the upper "loop" in the vertical plane.

Figure 4A:
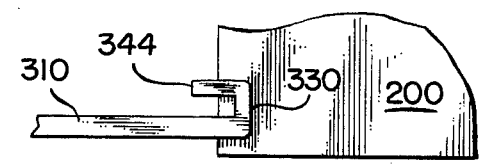
FIG. 4a is a bottom plan view of a portion of a substrate, showing the attachment thereto of the terminal lead of FIG. 3.
Figure 5:
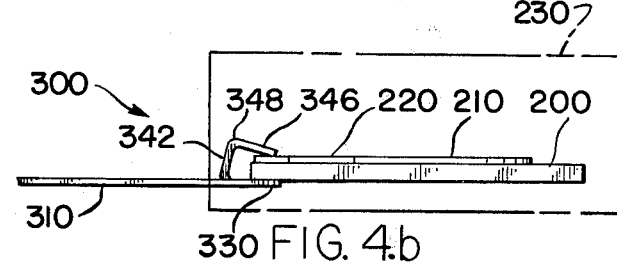
FIG. 5 is a plan view of a stamped lead frame blank prior to formation of the terminal leads.
Figure 5:
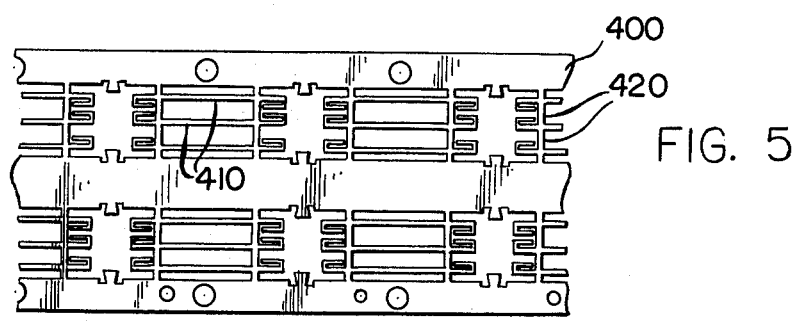

FIGS. 4a and 4b illustrate the relationship between the terminal clip 320 and the substrate 200. It can be seen that the horizontal hook-shaped portion 330 provides an extended length engaging contact with the underside of the substrate 200. The vertical leg 342 of the vertical hook-shaped portion 340 lies in close proximity to the side edge of the substrate, while the inwardly extending tab 346 engages a metallized area 220 on the top surface of the substrate.

It can thus be appreciated that the labyrinthine structure provided by the contiguously conjoined vertical and horizontal hook-shaped portions 330 and 340 provide an extended length of terminal lead embedded in the housing 230 (shown in dotted outline in FIG. 4b) between the surface of the housing and the solder joint between the tab 346 and the metallized area 220. Thus, there is an increased contact area between the lead and the housing material which absorbs the major portion of any stress resulting from bending the lead, thereby lessening the likelihood that the aforementioned solder joint will be loosened by such bending. This increased contact area between the lead and the housing material is also seen to be in close proximity to the substrate 200, and is thus inherently embedded relatively deeply within the housing material. The result is improved sealing between the terminal clip and the housing material as compared with the prior art structure.

FIGS. 5 through 12 illustrate the steps in the method of fabricating an electronic component having the terminal lead of FIGS. 3, 4a and 4b. Starting with FIG. 5, a lead frame blank 400 is stamped from a strip of metal having good electroconductive properties. The stamping may be done by any suitable stamping apparatus, although a progressive die apparatus is preferred. At this stage, "J"-shaped lead blanks 410 are formed in longitudinally connected pairs, with such pairs being connected in groups of three by a pair of transverse tie bars 420. It is by this first step in the process that the horizontal hook-shaped portions 330 are formed.

FIGS. 6 and 7 illustrate the lead frame 400 after the second step has been completed. This is the formation of the bend 348 (see FIG. 3) which will provide part of the vertical hook-like portion 340. Thus, as a result of this second step, the tab 346 is formed, but it is oriented vertically, as best shown in FIG. 7.

FIGS. 8 and 9 illustrate the third step: forming the bend 344 (FIG. 3), thereby completing the formation of the vertical hook-shaped portion 340, having the vertical leg 342 and the now horizontally extending tab 346. The terminal clips are now fully formed.

It will be appreciated that various types of bending apparatus, suitable for the operation illustrated in FIGS. 6 through 9 are well-known in the art, and, therefore need not be described.

FIGS. 10 and 11 show the lead frame 400 after the substrates 200 have been located therein, engaged between opposing pairs of terminal clips. The substrates illustrated each have deposited on the upper surface thereof an electronic component 210, as previously mentioned. As illustrated in the drawings, the component is a cermet resistive element, by way of example only. Also deposited on the top surface of the substrate are a plurality of metallized contact areas 220, as mentioned above. Some of the contact areas 220 are electrically connected to the resistive element 210 and serve as terminals for it. The remaining contact areas serve only as bonding points for effecting a solid solder joint with the terminal clip. In the example illustrated, each of the substrates 200 has six terminal leads each attached to it by means of a terminal clip. The leads connected to the right side of the substrate, as seen in FIG. 10, are connected at metallized areas that are terminals for the electric component; those connected to the left side are connected at metallized areas that are merely bonding points.

Once the substrates are properly located as shown in FIGS. 10 and 11, the terminal clips are soldered to their associated metallized contact areas, by conventional means well-known in the art. Then the housing, of a suitable thermoplastic material, is molded around the substrate leaving a circular opening in the top surface thereof. Installed in this opening are the remaining parts of the electrical component, a potentiometer in the illustrated example. Thus a rotor (designated by the numeral 450 in FIG. 12) having a contact spring (not shown) for contacting the resistive element 210, a sealing O-ring (not shown), and a retaining ring (designated by the numeral 470 in FIG. 12) are installed at this stage in the procedure, with the housing being staked to hold these elements in place.

Finally, the tie bars 420 are punched out, the completed components are separated from the lead frame, and the housing and the leads are trimmed to the configuration shown in FIG. 12, with those leads which are attached to electrical terminals (as previously discussed) being left long, and those attached at the previously mentioned bonding points being clipped substantially flush with the housing.

Thus, there has been described a terminal lead having a terminal clip which provides improved sealing and diminished solder joint stress, and which achieves these results with a structure that readily lends itself to manufacture by the relatively simple and economical technique described above.

It is pointed out that although the present invention has been shown and described with reference to a particular embodiment, nevertheless various changes and modifications obvious to one skilled in the art to which the invention pertains are deemed to lie within the purview of the invention.

What is claimed and desired to be secured by Letters Patent of the United States is:

1. In an electronic device, of the type having a component deposited onto a substrate, metallized contact areas on said substrate to provide an electrical path for said component, and a molded housing encasing said substrate, an improved terminal lead for attachment to said substrate, comprising:
   an elongate metal strip having first and second ends; and
   clip means formed in said strip proximate one of said ends, said clip means comprising first and second contiguous orthogonal loops, whereby said first and second loops are each in contact with a different opposing surface of said substrate when said clip means is attached to said substrate.

2. The terminal lead of claim 1, wherein said substrate has a top surface bearing said component and said metallized areas, a bottom surface, and a side surface adjoining said top and bottom surfaces, and wherein the attachment of said clip means to said substrate brings at least a part of said first loop into engaging contact with said bottom surface, and at least a part of said second loop into engaging contact with said top surface or a metallized area thereon, with a portion of said second loop lying adjacent said side surface.

3. The terminal lead of claim 2, wherein said first loop comprises a hook-shaped portion lying in a plane substantially parallel to the plane of said bottom surface, and said second loop portion comprises a substantially vertical portion having a lower juncture with said first loop and an upper juncture with a substantially horizontal portion which extends inwardly and downwardly to said upper surface from said upper juncture.

4. A terminal lead for connection to a substrate having a horizontal top surface, a horizontal bottom surface, a vertical side surface adjoining said top and bottom surfaces, and a metallized area on said top surface, said terminal lead comprising:
   an elongate strip of metal having a substantially straight portion; and
   clip means formed in said strip and contiguous with said straight portion at one end thereof, said clip means comprising:
   a horizontally-hooked portion integral and contiguous with said one end of said straight portion; and
   a vertically-hooked portion, integral and contiguous with said horizontally-hooked portion;
   whereby the engagement of said substrate between said horizontally-hooked portion and said vertically-hooked portion creates (a) an intimate contact between said bottom surface of said substrate and at least a substantial part of said horizontally-hooked portion, and (b) an engaging contact between said metallized area on said stop surface of said substrate and at least a part of said vertically-hooked portion.

5. A method of forming a set of terminal leads for an electronic device of the type having a substrate, with metallized contact areas and an electronic component deposited on a surface of said substrate, said method comprising the steps of:
   (a) stamping out a lead frame having a plurality of substantially "J"-shaped lead elements;
   (b) making a first bend in each of said lead elements to form an upwardly extending tab on the ends thereof;
   (c) forming a clip on the end of each of said lead elements by making a second bend in said lead elements whereby said tab is oriented horizontally and forms a substantially vertically-oriented hook-shaped portion connected to a substantially horizontally-oriented hook-shaped portion;

(d) locating a substrate in said lead frame by engaging said substrate between at least one opposing pair of said clips;

(e) soldering said clips to said metallized areas;

(f) encasing said substrate and said clips in a thermoplastic housing;

(g) removing said encased substrate and clips from said lead frame by separating said lead elements from said lead frame; and (h) trimming said lead elements to their desired lengths.

* * * * *